United States Patent [19]
Imai et al.

[11] Patent Number: 5,508,781
[45] Date of Patent: Apr. 16, 1996

[54] PRINTED CIRCUIT BOARD

[75] Inventors: Toshihiko Imai; Mitsumasa Okubo; Akira Watanabe, all of Tokyo, Japan

[73] Assignee: Olympus Optical Co., Ltd., Tokyo, Japan

[21] Appl. No.: 207,843

[22] Filed: Mar. 8, 1994

[30] Foreign Application Priority Data

Mar. 15, 1993 [JP] Japan .................................. 5-054355
Apr. 1, 1993 [JP] Japan .................................. 5-075820

[51] Int. Cl.⁶ .................................................. G03B 7/00
[52] U.S. Cl. ........................................... 354/485; 354/286
[58] Field of Search ..................................... 354/286, 485

[56] References Cited

U.S. PATENT DOCUMENTS

| | | | |
|---|---|---|---|
| 3,670,639 | 6/1972 | Harnden, Jr. ................... | 354/485 |
| 4,596,454 | 6/1986 | Kawai et al. ................... | 354/286 |
| 4,682,871 | 7/1987 | Metabi .......................... | 354/485 |
| 4,964,697 | 10/1990 | Fuziwara ....................... | 354/485 |
| 4,990,948 | 2/1991 | Sasaki et al. ................. | 354/485 |
| 4,999,656 | 3/1991 | Shimizu et al. ................ | 354/286 |
| 5,327,184 | 7/1994 | Nomura ......................... | 354/485 |

FOREIGN PATENT DOCUMENTS 166293  7/1988  Japan .

Primary Examiner—Russell E. Adams
Attorney, Agent, or Firm—Louis Weinstein

[57] ABSTRACT

The present invention provides a printed circuit board installed in a lens barrel with an imaging optical system. In an installed state, the printed circuit board comprises: a ring-shaped portion disposed substantially perpendicular to the optical axis of the imaging optical system wherein an aperture is provided at a central portion of the ring-shaped portion so that an imaging light beam may pass through the aperture; and an extending board portion that extends outward from the ring-shaped portion wherein electrical components may be mounted on the surface of the extending board portion. After the ring-shaped portion and the extending board portion have been bent, the above-described flexible printed circuit board is inserted into the lens barrel in such a manner that the plane of the extending board portion on which the electrical components are mounted is parallel to the optical axis of the imaging optical system. This printed circuit board provides high efficiency electrical interconnections in the lens barrel.

20 Claims, 10 Drawing Sheets

PRINTED CIRCUIT BOARD

BACKGROUND OF THE INVENTION

1. Field of the Invention

The present invention relates to a printed circuit board. More specifically, the present invention relates to a printed circuit board that is disposed in a lens barrel with an imaging optical system, or disposed in a lens barrel provided with a ring-shaped motor.

2. Related Art Statement

There are various flexible printed boards proposed for use within a lens barrel having an imaging optical system. For example, Japanese Patent Application Laid-Open No. 63-166293 (1988) discloses a technique in which a flexible printed circuit (FPC) board having a nearly-ring-shaped portion is disposed at an end portion of a lens barrel so that electrical components may be mounted on the above-described nearly-ring-shaped portion. In this technique, protruding portions such as mounts for the connection to other components are formed on the nearly-ring-shaped portion.

U.S. Pat. No. 4,990,948 discloses a technique in which electric components are mounted on a band-shaped FPC board and then this FPC board is bent in the direction parallel to the optical axis so as to form a polygon, and finally the FPC board is put into a polygon-shaped case along the inner wall faces. However, in the above-mentioned techniques disclosed in Japanese Patent Application Laid-Open No. 63-166293(1988) and U.S. Pat. No. 4,990,948, when the FPC-board is disposed in a lens barrel with a lens, if the diameter of the optical path associated with the lens is large, then the area of the FPC-board must be reduced, which results in limitation in a space available for the mounting of electrical components or for electrical interconnections. As a result, a large extent of modifications in interconnection routing is required, and in some cases, it will be impossible to make interconnection between some components.

Another problem in the conventional techniques is that there is a need to provide portions for making electrical connection to other external components, which causes an increase in complexity of the connecting processes and also causes an increase in the area of the FPC-board, which in turn causes an increase in cost. Furthermore, in the technique disclosed in U.S. Pat. No. 4,990,948, because an FPC-board has a form of a band, if the number of components to be mounted on the FPC-board is increased, these mounted components take the area required for electrical interconnections, which makes it difficult to achieve high density mounting of components. Furthermore, the lengths of interconnections along circumferential paths between end portions become long, which causes a reduction in the efficiency of the interconnection design.

Various techniques have also been proposed for the arrangement of electrical components on a printed circuit board disposed in a lens barrel in which a ring-shaped motor such as an ultrasonic motor is used as a driving power source.

For example, in a conventional printed circuit board, as shown in perspective views of FIGS. 11 and 12 which illustrate arrangements of major elements of a lens barrel, a donut-shaped printed circuit board (referred to as a PC hereinafter) 101 or 102 is disposed at a rear side (in the case of FIG. 11) or at a front side (in the case of FIG. 12) of a ring-shaped motor or an ultrasonic motor (referred to as an USM hereinafter) 104 that is disposed within a frame 103 of a lens barrel in a fashion that the USM 104 is coaxial with respect to the optical axis O, so as to achieve a high space-efficiency arrangement. In the PCs 101 and 102 shown in FIGS. 11 and 12, electrical components such as integrated circuits 101a, 102a, and resistors 101b, 102b are mounted on the respective PCs 101 and 102.

In another conventional technique for arranging electrical components on the printed circuit board, as shown in perspective views of FIGS. 13 and 14 which illustrate arrangements of major elements of lens barrel, a polygon-shaped barrel FPC 111 or 112 that has been bent to form a shape of a polygon is disposed at a rear side (in the case of FIG. 13) or at a front side (in the case of FIG. 14) of a USM 114 that is disposed within a frame 113 of a lens barrel in a fashion that the USM 114 is coaxial with respect to the optical axis O, so as to achieve a high space-efficiency arrangement. In the abovedescribed PCs 111 and 112 shown in FIGS. 13 and 14, electrical components such as integrated circuits 111a and 112a, and resistors 111b and 112b are mounted on respective PCs 111 and 112.

In still another conventional technique for arranging electrical components, as shown in a perspective view of FIG. 15 which illustrate an arrangement of major elements, a polygon-shaped barrel FPC 121 that has been bent to form a shape of a polygon is disposed around the outer periphery of a USM 124 that is disposed within a frame 123 of a lens barrel in a fashion that the USM 124 is coaxial with respect to the optical axis O, so as to achieve a high space-efficiency arrangement. In the PC 121 shown in FIG. 15, electrical components such as an integrated circuit 121a and a resistor 121b are also mounted on the PC 121.

However, in the above-described conventional techniques shown in FIGS. 11–14 for arranging electrical components on a printed circuit board for use in a lens barrel, there is a problem that a large length is required for lens frames 103 and 113 due to the manner of arrangement in which PCs 101, 102 or PCs 111, 112 are disposed at a front or rear side of USMs 104, 114.

In the case of the conventional technique shown in FIG. 15, a space around the outer periphery of the USM 124 is required for disposing the FPC 121, and thus there is a problem that the outer dimension of the lens barrel becomes large.

OBJECTS AND SUMMARY OF THE INVENTION

It is an object of the present invention to solve the above problems. More specifically, it is an object of the present invention to provide a printed circuit board that can provide a better efficiency in the arrangement of components and a better interconnection efficiency, which in turn provides a reduction in size of a lens barrel.

In one aspect of the present invention to achieve the above-described objects, a printed circuit board comprises an FPC to be disposed in a lens barrel with an imaging optical system, the FPC comprising: a first portion disposed in a plane that is substantially perpendicular to the axis of the imaging optical system, the first portion having an aperture through which a light beam associated with an image may pass; a second portion extending outward or inward from the first portion, electrical components being mounted on the surface of the second portion; and a portion disposed between the above-described first and second portions, the portion being bent before the portion is inserted into the lens barrel such that the surface of the second portion on which the electrical components are mounted may become parallel to the optical axis of the imaging optical system.

In another aspect of the present invention, there is provided a printed circuit board that is disposed in a lens barrel wherein the lens barrel comprises an imaging optical system, a ring-shaped motor comprising a ring-shaped stator and a ring-shaped rotor having a center of rotation that substantially coincides with the optical axis of the imaging optical system, and a ring-shaped space formed between the outer circumferential surface of the optical path of the imaging optical system and the inner circumferential surface of the ring-shaped motor, the printed circuit board having: a plane portion disposed in the above-described ring-shaped space in such a manner that the plane portion is substantially parallel to the optical axis of the imaging optical system; and an electrical component mounted on the plane portion.

Other aspects and advantages of the present invention will be apparent upon review of the following detailed description.

DETAILED DESCRIPTION OF THE PREFERRED EMBODIMENT

Referring to the figures, the preferred embodiments of the present invention will be described below.

Figure 1:
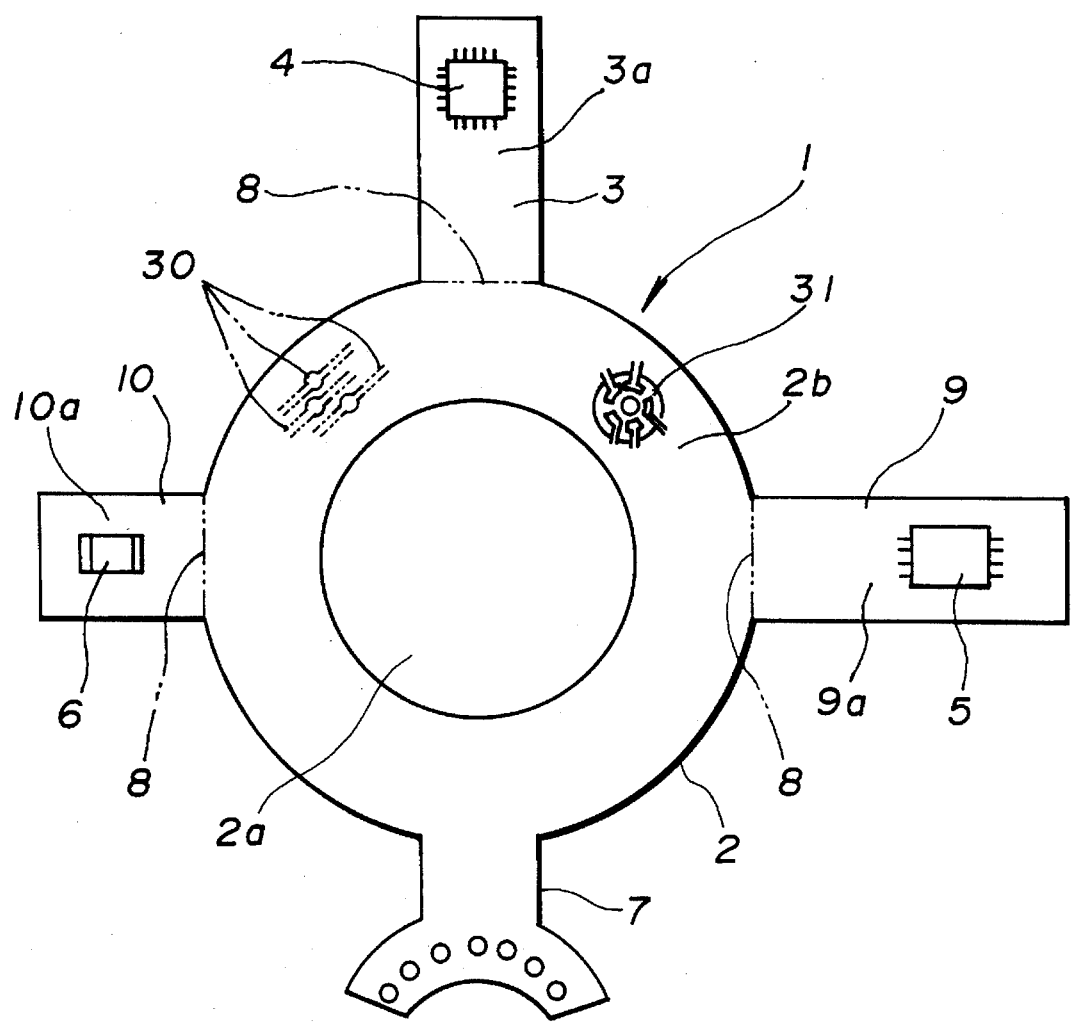
FIG. 1 is an expansion plan of a first embodiment of an FPC according to the present invention.
Figure 2:
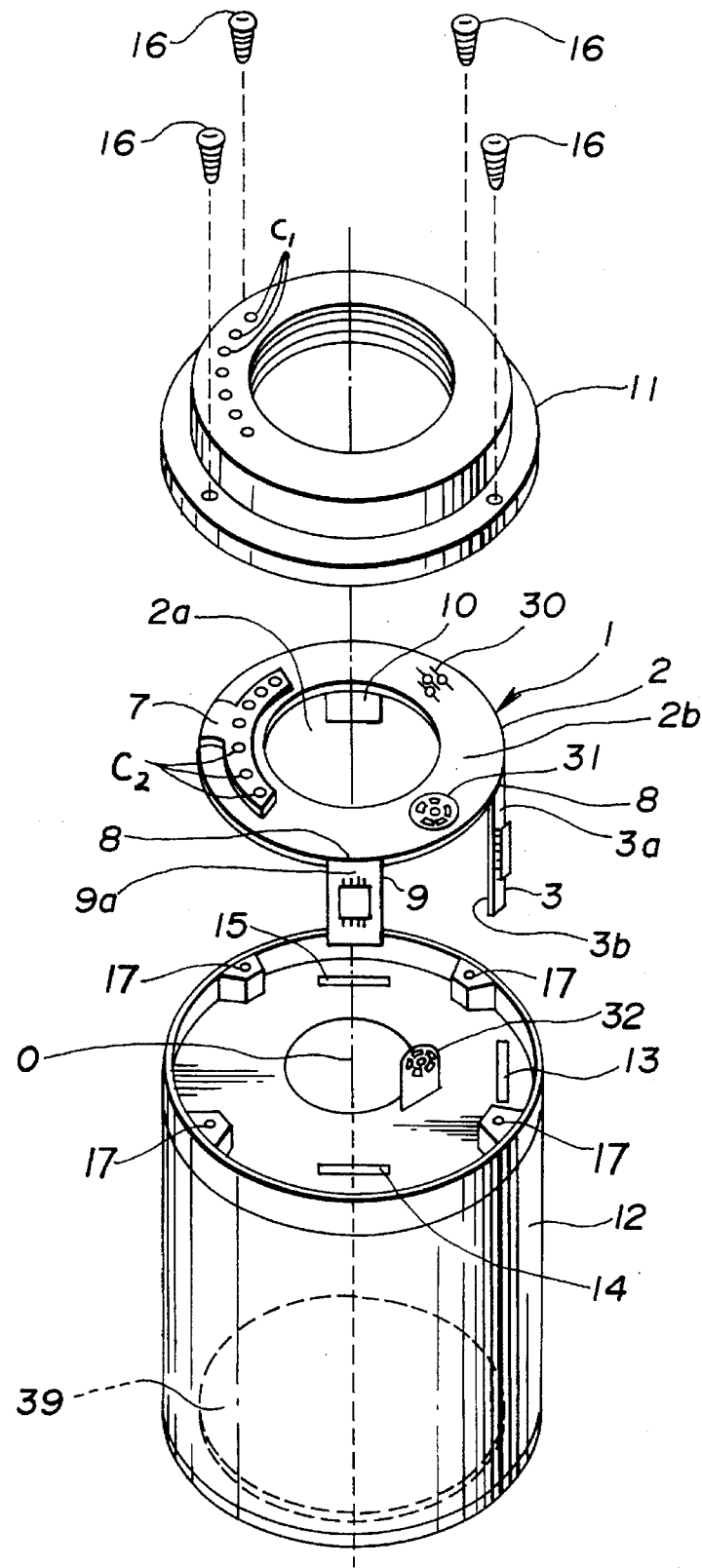
FIG. 2 is an exploded perspective view illustrating a state before the FPC of the first embodiment is disposed into a lens barrel.

FIG. 1 is an expansion plan of an FPC according to a first embodiment of a printed circuit board of the present invention. FIG. 2 is an exploded perspective view illustrating a state before the FPC of the first embodiment is put into a lens barrel. This FPC 1 comprises: a ring-shaped portion 2 acting as a first portion comprising a flat disk having an aperture 2a in the central part of the disk so that a light beam associated with an image may pass through the aperture 2a, wherein in a state after assembled, the ring-shaped portion 2 is disposed in a plane substantially perpendicular to the optical axis O of an imaging lens 39 serving as an imaging optical system (refer to FIG. 2); a second portion comprising a plurality of extending board portions 3, 9, and 10 that are in the same plane as the ring-shaped portion 2 while the extending board portions 3, 9, and 10 have not been bent; and a mount contact portion 7, wherein the plurality of the extending board portions 3, 9, and 10 and the mount contact portion 7 are formed in such a manner that all these elements extend outward from the ring-shaped portion 2.

Electrical components 4, 5, and 6 are mounted on mounting surfaces 3a, 9a, and 10a of the above-described extending board portions 3, 9, and 10, wherein the mounting surfaces 3a, 9a, and 10a correspond to the drawing plane of FIG. 1. Furthermore, there are bending (i.e. bendable) portions 8 at respective end portions of the extending board portions 3, 9, and 10, as denoted by the two-dot chain lines in FIG. 1. When put into the lens barrel, the extending board portions 3, 9, and 10 are bent at the bending portions 8 toward the back side of the plane of FIG. 1 so that the extending board portions 3, 9, and 10 are substantially perpendicular to the ring-shaped portion 2 (refer to FIG. 2).

As described above, the extending board port ions 3, 9, and 10 are designed to form unidirectional units extending outward in a unidirectional fashion.

The mount contact portion 7 extends outward from a position of the ring-shaped portion 2 that is different from positions from which the extending board portions 3, 9, and 10 extend. Furthermore, at the end of the mount contact portion 7, extending portions extend in two different directions to form a shape of a circular arc. A plurality of contacts are disposed on these extending portions. When put into the lens barrel, the mount contact portion 7 is bent at 180° at its end portion in the direction opposite to that in which the extending board portions 3, 9, and 10 are bent, to form a V-like shape so that the mount contact portion 7 will come into contact with the ring-shaped portion 2 (refer to FIG. 2).

The ring-shaped portion 2 is provided with only an interconnection pattern, and no electrical components are mounted on the ring-shaped portion 2. As shown in FIG. 1, the ring-shaped portion 2 is provided with land portions 30 used for checking a circuit and also provided with contacts 31 for connecting other circuits disposed in the lens barrel. The checking land portions 30 and the connecting contacts 31 are formed such that portions of these elements disposed on the back side of the ring-shaped portion 2 will be exposed to the outside and thus will be visible when a lens-mount-side cover element 11 (refer to FIG. 2) which will be described later is removed.

FIG. 2 shows how the FPC 1 having the above-described configuration is put into lens barrel. In this figure, reference numeral 11 denotes the cover element disposed at the lens mount side, reference numeral 12 denotes the lens barrel, and reference numeral 39 denotes the imaging lens. Reference letter O denotes the optical axis of the imaging optical system comprising the imaging lens 39.

The lens barrel 12 has a flange plate at its upper position. This flange plate has apertures or opened spaces 13, 14, and 15 that are formed substantially parallel to the direction of the optical axis. The above-described extending board portions 3, 9, and 10 of the FPC 1 are bent at about 90° at the bending portions 8, and then the extending board portions 3, 9, and 10 are inserted into corresponding opened spaces 13, 14, and 15 (refer to FIG. 4). Thus, the extending board portions 3, 9, and 10 are disposed in such a manner that the mounting surfaces 3a, 9a, and 10a on which the above-described electric components 4, 5, and 6 are mounted are substantially parallel to the optical axis O.

At this stage, the lower surface of the ring-shaped portion 2 of the FPC 1 will come into contact with the flange plate of the lens barrel 12. On the other hand, the above-described mount contact portion 7 is bent at about 180° upward with respect to the upper surface of the ring-shaped portion 2 to form a V-like shape so that the mount contact portion 7 will come into contact with the upper surface of the ring-shaped portion 2.

Furthermore, an FPC 32 is disposed passing through the flange plate, and an end portion of the FPC 32 protrudes from the upper surface of the flange plate, such that the FPC 32 will be located under the contacts 31 for the connection when the FPC 1 is put in place. Inside the lens barrel 12, the wiring on FPC 32 is connected to various actuators such as a motor for driving a diaphragm. After the FPC 1 has been put into the lens barrel 12, the FPC 32 is bent outward at about 90° so that the FPC 32 may be electrically connected to the connecting contacts 31.

After the FPC 1 has been put into the lens barrel 12, the lens-mount-side cover element 11 is put on the lens barrel 12 so that the lens barrel 12 is covered with the cover element 11. The cover element 11 is fastened to the outer surface of the flange plate with fastening screws 16 which are threaded into openings 17 to obtain a complete, assembled lens barrel as shown in the perspective view of FIG. 3. At this stage, mount contacts $C_1$ passing through the cover element 11 from the upper surface to lower surface get in contact with corresponding contacts $C_2$ of the mount contact portion 7.

Figure 3:
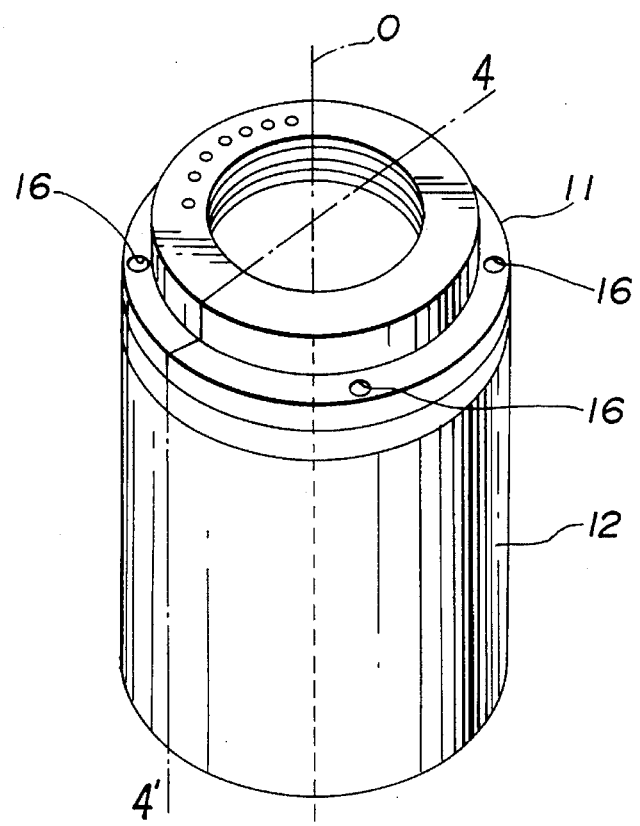
FIG. 3 is an perspective view illustrating a state after the FPC of the first embodiment has been disposed into a lens barrel and the assembling of the lens barrel has been completed.
Figure 4:
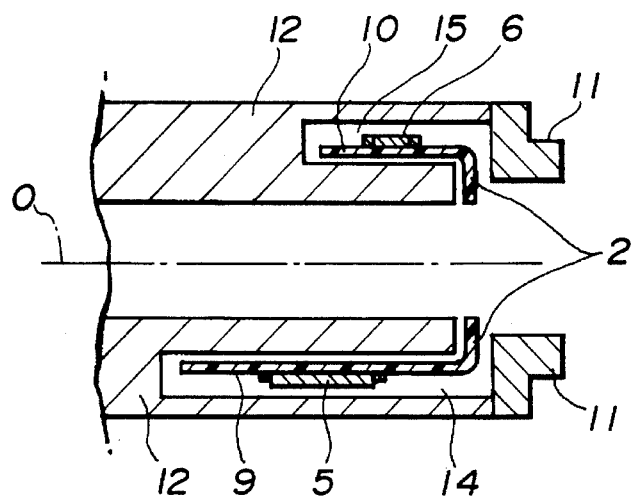
FIG. 4 is an enlarged fragmentary cross sectional view taken in the line 4–4' of FIG. 3, illustrating the major portion of the lens barrel including the FPC according to the first embodiment.

FIG. 4 is an enlarged fragmentary cross sectional view taken in the line 4–4' of FIG. 3, illustrating the major portion of the lens barrel 12 including the FPC 1.

The FPC with the above-described arrangement according to the first embodiment of the present invention can provide high efficiency electrical connections. That is, even in the case where the diameter of the optical path associated with the lens is large and the space in the rear portion in the lens barrel available for electrical connection is very limited, high mounting of a high density of electrical components can be achieved. Furthermore, all components to be mounted are mounted on the extending board portions 3, 9, and 10 which extend outward from the ring-shaped portion 2, and thus the ring-shaped portion 2 can be used only for the interconnection pattern without any inhibition by electrical components. As a result, it is possible to achieve a high efficiency interconnection design without very long interconnections.

Furthermore, the extending board portions 3, 9, and 10 are designed to form units extending outward in a unidirectional fashion, and thus the same extending board portions 3, 9, and 10 can be used for various different diameters of lenses without re-artwork as long as the same components can be used. As a result, the number of production processes can be reduced. Moreover, because the checking land portions 30 and the connecting contacts 31 will be exposed when the lens-mount-side cover element 11 is removed, electrical tests can be easily performed after assembling, and the workability in connection with other FPCs in the lens barrel can be improved.

Figure 5:
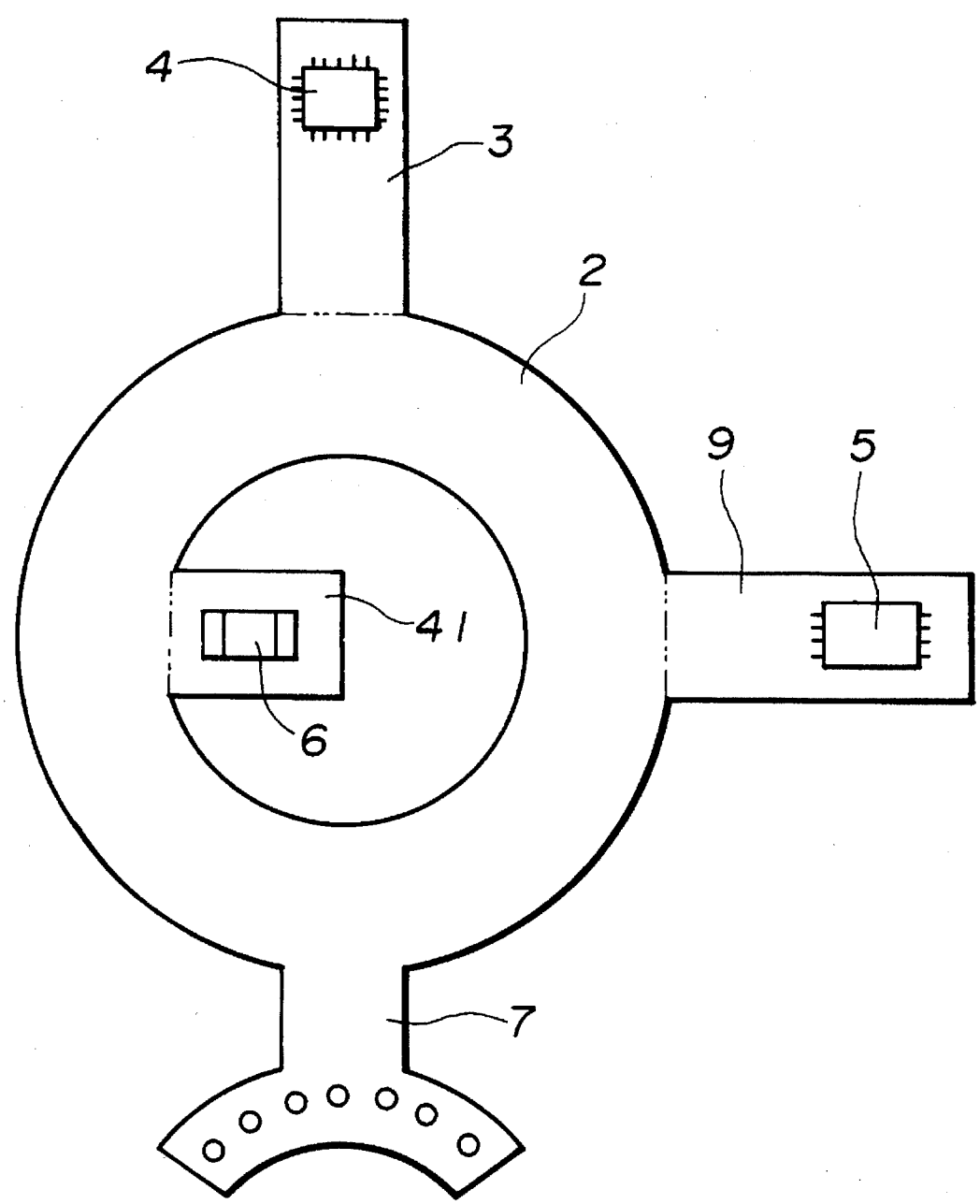
FIG. 5 is an expansion plan of an FPC modified from the first embodiment according to the present invention.

In the first embodiment described above, the extending board portions 3, 9, and 10 are formed in such a manner that all these elements extend only outward from the ring-shaped portion 2. Alternatively, as shown in the expansion plan of FIG. 5, the FPC of the first embodiment may be modified in such a manner that some extending board portions, for example extending board portion 41, extends inward from the ring-shaped portion 2. Thus, the extending board portions may extend in either direction, inward or outward.

Now, a second embodiment according to the present invention will be described below.

Figure 6:
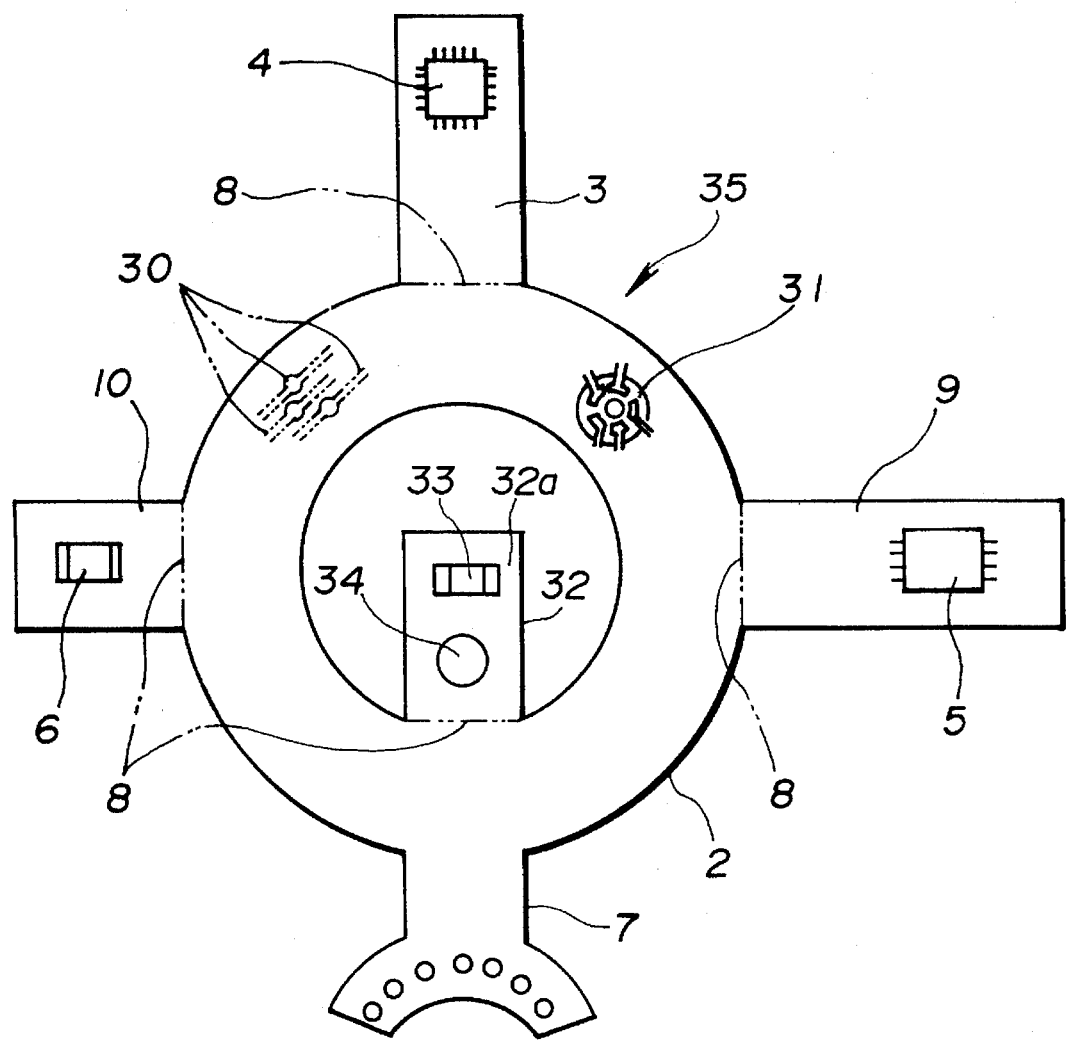
FIG. 6 is an expansion plan of a second embodiment of an FPC according to the present invention.

FIG. 6 is an expansion plan of the second embodiment of an FPC.

In this second embodiment, the FPC 35 comprises extending board portions 3, 9, and 10 as in the first embodiment, and further comprises a second extending board portion 32 extending inward from the position opposite to the mount contact portion 7 via the ring-shaped portion 2. The other parts of the configuration are the same as those of the first embodiment, and the description of these parts will not be repeated. The FPC 35 is put into the lens barrel 12 in the same manner as in the case of the first embodiment.

Electrical components 33 and 34 are mounted on the extending board portion 32. A bending portion 8 is formed at the boundary between the extending board portion 32 and the ring-shaped portion 2. The electrical components 33 and 34 form a power supply circuit, and the electrical connections to the electrical components 33 and 34 are made directly via the mount portion.

The extending board portion 32 is bent along the bending portion 8 when the FPC 35 is installed in the lens barrel 12. At this stage, the mounting surface 32a on which the electrical components are mounted is substantially parallel to the optical axis O.

In addition to the advantages similar to those of the first embodiment, the arrangement according to the second embodiment provides an advantage that an electrical system, which is required to be disposed at a location as near to the mount portion as possible, can be located very near the mount portion. Thus, a high efficiency interconnection design can be achieved without using long interconnections. Furthermore, this arrangement also provides low noise performance.

In the above-described first and second embodiments, the bending portions 8 of the FPC comprise a notch or a plurality of successive holes (not shown) to achieve easy bending, or alternatively overlaying materials are removed from the bending portions 8 for the same purpose. In the embodiments described above, electrical components are mounted only on one surface of the FPC. However, the present invention is not limited to that, and electrical components may be mounted on both surfaces, for example, both the mounting surface 3a and the back surface 3b (refer to FIG. 2) of the extending board portion 3.

In the above-described first and second embodiments, the mount contact portion 7 extends outward from the ring-shaped portion 2. Alternatively, the mount contact portion 7 may also extend inward from the ring-shaped portion 2 to achieve the same purpose.

Now, a lens barrel including an FPC serving as a printed circuit board for mounting electrical components according to a third embodiment of the present invention will be described below.

Figure 7:
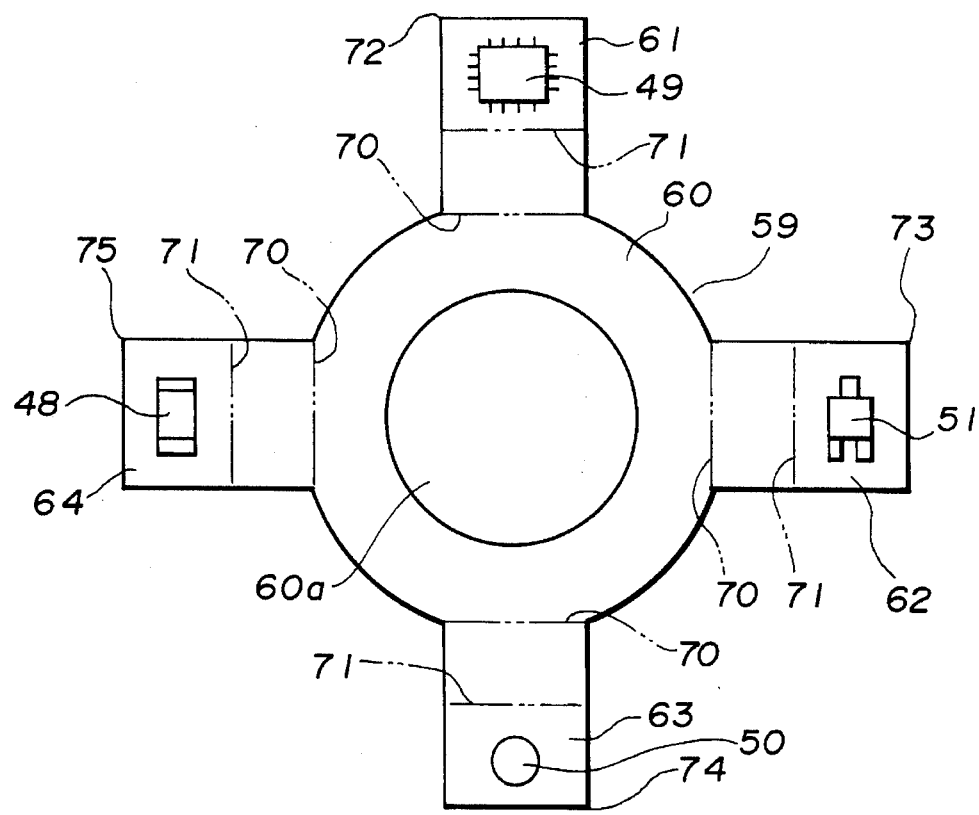
FIG. 7 is an expansion plan illustrating an FPC according to a third embodiment of the present invention, which is to be disposed in a lens barrel.
Figure 8:
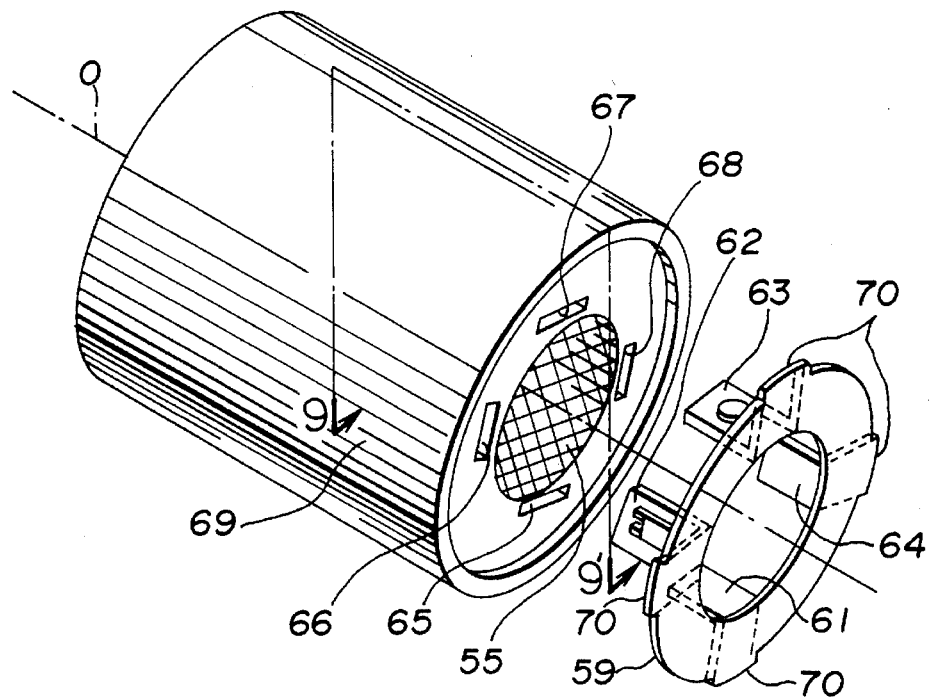
FIG. 8 is an exploded perspective view illustrating the major portion of the lens barrel including the FPC according to the third embodiment.
Figure 9:
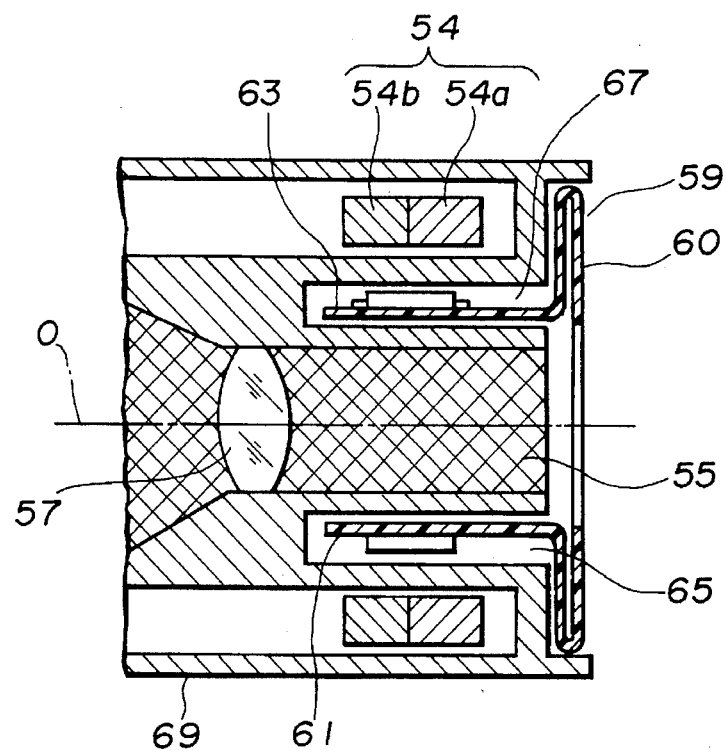
FIG. 9 is a cross sectional view taken in the line 9–9' of FIG. 8.
Figure 10:
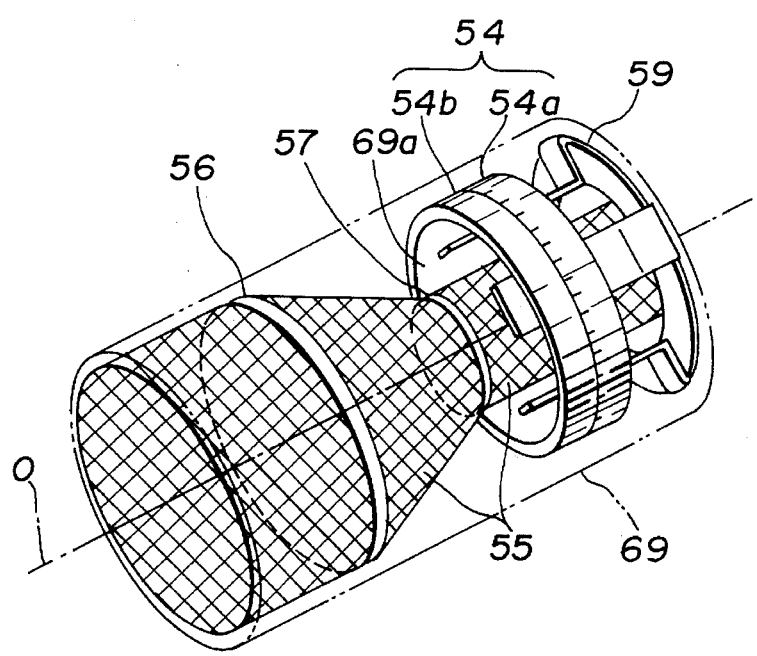
FIG. 10 is a perspective view illustrating the arrangement of major elements including the FPC in the lens barrel shown in FIG. 8.
Figure 11:
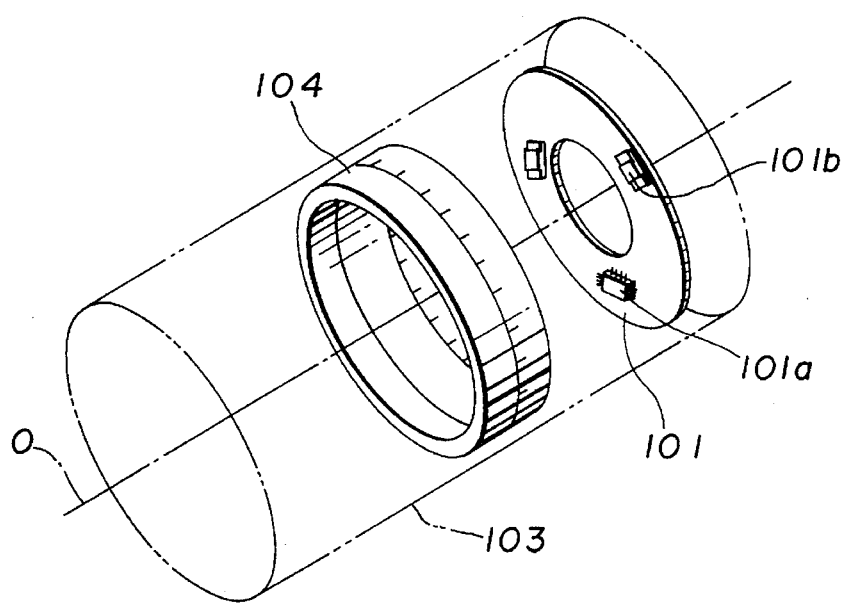
FIG. 11 is a perspective view illustrating a major elements of a lens barrel including a conventional printed circuit board.
Figure 12:
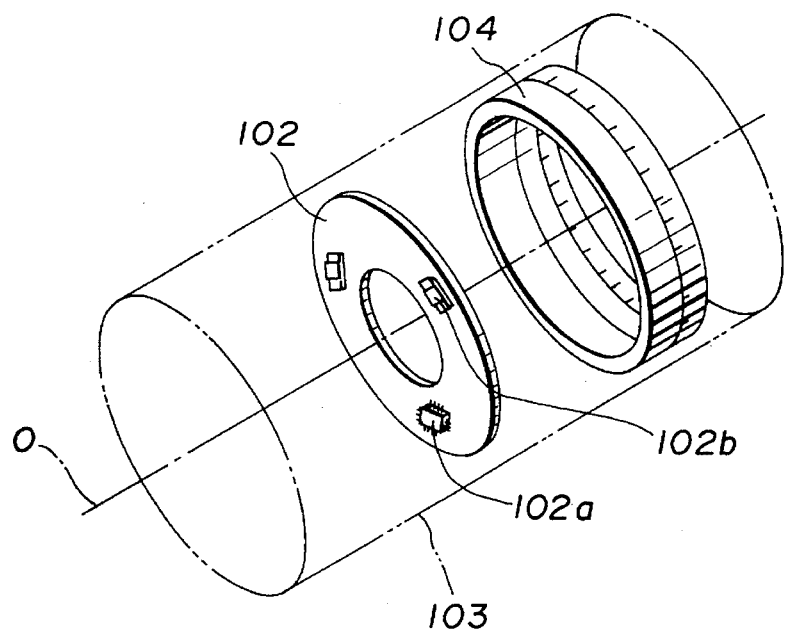
FIG. 12 is a perspective view illustrating a major elements of a lens barrel including another conventional printed circuit board.
Figure 13:
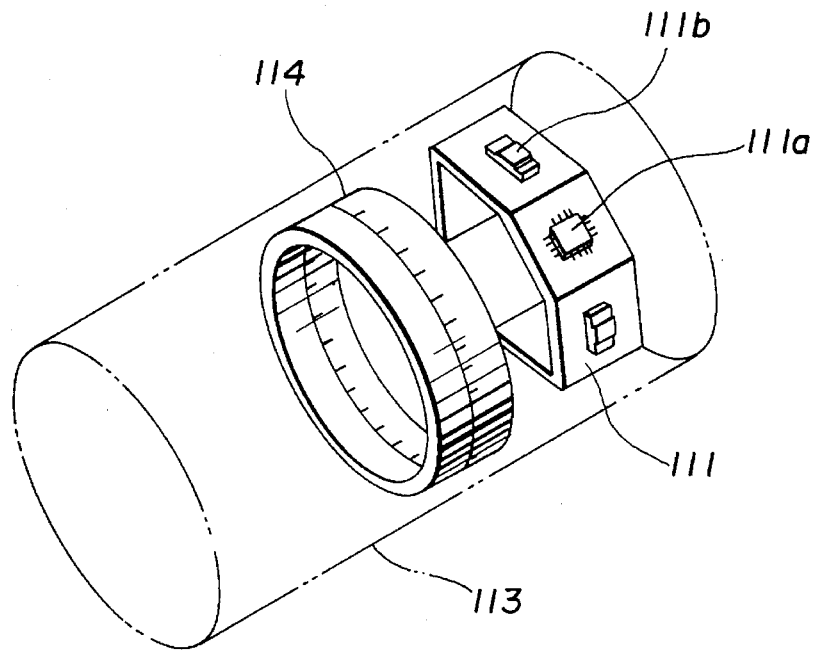
FIG. 13 is a perspective view illustrating a major elements of a lens barrel including still another conventional printed circuit board.
Figure 14:
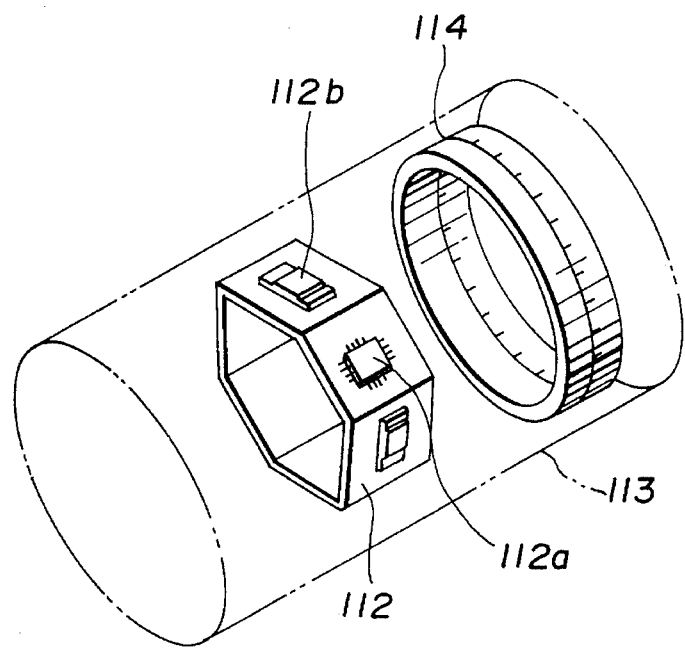
FIG. 14 is a perspective view illustrating a major elements of a lens barrel including another conventional printed circuit board.
Figure 15:
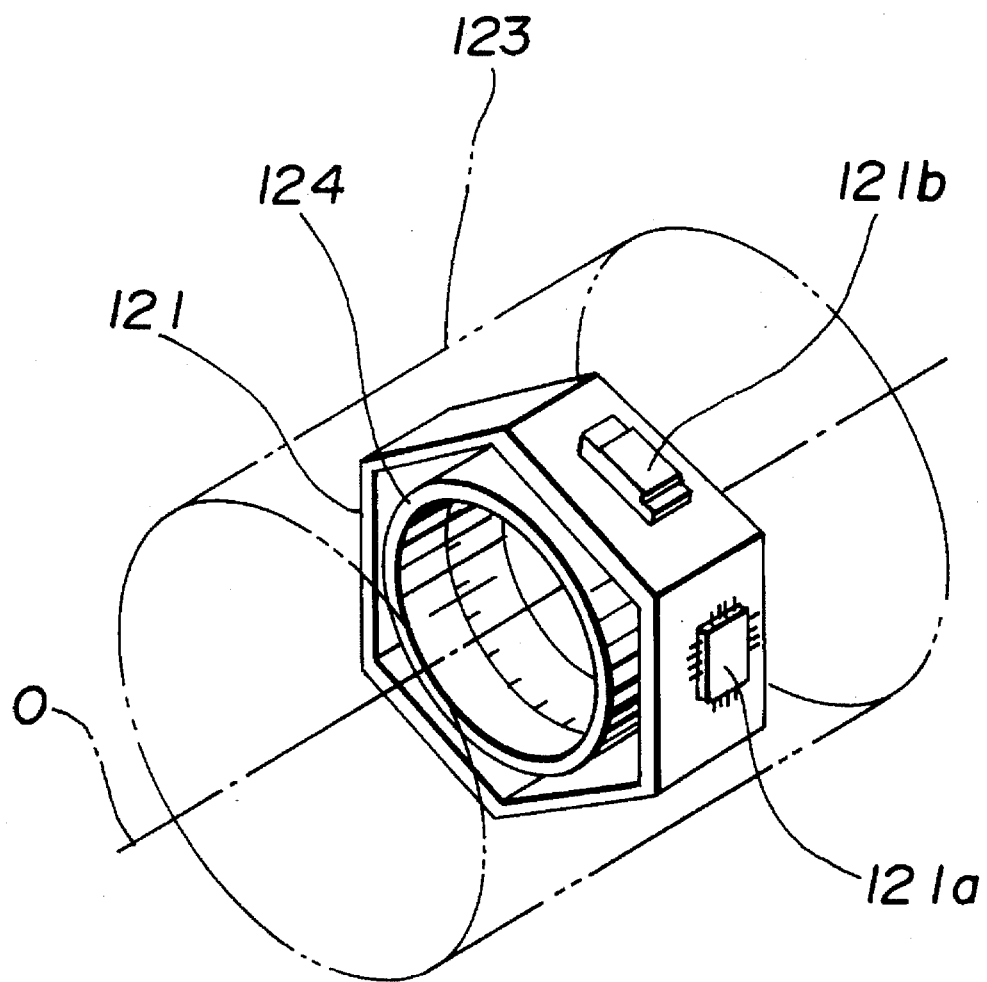
FIG. 15 is a perspective view illustrating a major elements of a lens barrel including still another conventional printed circuit board.

FIG. 7 is an expansion plan illustrating an FPC according to the third embodiment, which is to be disposed in a lens barrel. FIG. 8 is an exploded perspective view illustrating the lens barrel including the above-described FPC. FIG. 9 is a cross sectional view taken in the line 9–9' of FIG. 8. FIG. 10 is a perspective view illustrating the major elements of the above-described lens barrel.

As shown in FIG. 10 or other figures, the lens barrel consists chiefly of: a lens barrel portion 69; an imaging optical system comprising imaging lenses 56 and 57; a USM 54 serving as a ring-shaped motor comprising a stator 54a and a rotor 54b which rotates about the optical axis O of the imaging lenses; and an FPC 59 on which electrical components are mounted.

In FIGS. 8, 9, and 10, the regions of optical paths associated with imaging lenses 56 and 57 are denoted by cross-hatched optical path regions 55. There is a ring-shaped space 69a between the optical path region 55 and the inner circumferential surface of the USM 54 (refer to FIG. 10).

As shown in FIG. 7, the FPC 59 has a first portion comprising a ring-shaped portion 60. There is a circular aperture 60a in the central portion of the ring-shaped portion 60. The FPC 59 also has second portions including extending portions 72, 73, 74, and 75 which extend outward from the ring-shaped portion 60 in four directions perpendicular to each other. Circuit-interconnection patterns are printed on the ring-shaped portion 60. The extending portions 72, 73, 74, and 75 each have a first bending line 70 along the circumference of the ring-shaped portion 60, and also have a second bending line 71 at a predetermined distance apart from the first bending line 70. There are provided mounting planes 61, 62, 63, and 64 in the areas outside the bending lines 71. Electrical components including IC 49, a resistor 48, and other electrical components 51 and 50 are mounted on the mounting planes 61, 62, 63, and 64.

The FPC 59 having the configuration described above is formed by bending when it is installed. That is, the extending portions 72, 73, 74, and 75 are bent inward at 180° at the first bending lines, and then are bent upward at 90° at the second bending lines 71. The shape of the FPC after the above-described forming becomes that shown in the exploded perspective view of FIG. 8. At this stage, the mounting planes 61, 62, 63, and 64 are connected to each other in the circumferential direction via the ring-shaped portion 60, wherein the ring-shaped portion 60 is located at an outer position at radial directions compared to the mounting planes 61, 62, 63, and 64.

Spaces or rectangular slots 65, 66, 67, and 68 are provided in the ring-shaped space 69a between the USM 54 and the optical path region 55 in the rear portion of the lens barrel portion 69, in such a manner that the rectangular slots 65, 66, 67, and 68 are parallel to the optical axis O. These rectangular slots 65, 66, 67, and 68 are used to accept the mounting planes 61, 62, 63, 64 of the FPC 59 in such a manner that the mounting planes 61, 62, 63, and 64 are inserted into the corresponding rectangular slots 65, 66, 67, and 68 from the rear side of the lens barrel portion 69.

The assembling of the lens barrel is performed as follows. First, the USM 54 is installed in the lens barrel portion 69. Then, the FPC 59 is installed in such a manner that the mounting planes 61, 62, 63, and 64 of the FPC 59 with mounted electrical components such as IC 49 are inserted into the rectangular slots 55, 66, 67, and 68 from the rear side of the lens barrel portion 69, keeping the mounting planes 61, 62, 63, and 64 parallel to the optical axis O. At this stage, the mounting planes 61, 62, 63, and 64 partially overlap the USM 54 in the optical axis direction.

In the lens barrel configured in the above-described manner according to this embodiment, the mounting planes 61, 62, 63, and 64 of the FPC 59 are located between the USM 54 and the optical path region 55 in the rear portion of the lens barrel portion 69, and thus the FPC 59 never affects (i.e., interferes with) the optical path of the imaging optical system. Furthermore, the FPC 59 can be installed without expanding either the outside dimension or the length of the lens barrel portion 69. Furthermore, electric circuits are installed on the mounting planes 61, 62, 63, and 64 of the FPC 59, and the patterns for interconnections between the electric circuits are provided on the ring-shaped portion 60 of the FPC so as to achieve short-length and high-efficiency electrical interconnections without any inhibition by components.

What is claimed is:

1. A printed circuit board disposed in a lens barrel with an imaging optical system, including:

a first board portion, an aperture being provided at a central portion of said first board portion such that an imaging light beam may pass through said aperture without interference, said first board portion being disposed in a plane which is substantially perpendicular to an optical axis of said imaging optical system;

a plurality of board portions, said second board portions extending in one of an inward and outward radial direction from said first board portion, electrical component chips being mounted on a surface of each of said second board portions, said second board portions being mechanically and electrically connected to one another through said first board portion; and a bendable portion provided between said first board portion and each of said second board portions, wherein when said printed circuit board is installed in said lens barrel, said bendable portion is bent to a position where a plane of said second portion on which the electrical component chips are mounted are substantially parallel to the optical axis of the imaging optical system.

2. A printed circuit board according to claim 1, wherein said printed circuit board is a flexible printed circuit board.

3. A printed circuit board according to claim 1, wherein said first portion is ring-shaped and said aperture is at the center thereof.

4. A printed circuit board according to claim 1, wherein no electrical components are mounted on said first portion.

5. A printed board according to claim 1, wherein a back surface of said first portion is provided with a pattern used for electrical connection to other electrical components.

6. A printed circuit board according to claim 1, wherein a back surface of said first portion is provided with terminal means for testing electrical components mounted on said second portion.

7. A printed circuit board according to claim 1, wherein said printed circuit board has a plurality of said second portions joined to said first portion.

8. A printed circuit board according to claim 1 comprising:

a third radial portion bendably coupled to said first portion and having a plurality of contacts;

a cover releasably coupled to said lens barrel for enclosing said printed circuit board and having contact means engageable with associated contacts on said second radial portion for connection with circuitry external to said lens barrel.

9. A lens barrel having a printed circuit board installed therein, said lens barrel comprising an imaging optical system, a ring-shaped motor comprising a ring-shaped stator and a ring-shaped rotor having a rotation center that substantially coincides with an optical axis of said imaging optical system, and a ring-shaped space that is formed between an outer circumferential surface of the optical path of said imaging optical system and an inner circumferential surface of said ring-shaped motor, said printed circuit board including:

a first planar portion substantially parallel to the optical axis of said imaging optical system, said planar portion being disposed in said ring-shaped space and being joined to a second portion substantially perpendicular to said optical axis; and an electrical component chip mounted on said planar portion.

10. A printed circuit board according to claim 9, wherein said printed circuit board includes a plurality of said planar portions, said plurality of planar portions being connected to each other in a circumferential direction.

11. A printed circuit board according to claim 10, wherein connecting portions for connecting said planar portions to each other are located at rear positions in the optical axis direction with respect to positions of said planar portions.

12. A printed circuit board according to claim 10, wherein connecting portions for connecting said planar portions to each other are located at outer locations in radial directions with respect to positions of said planar portions.

13. A printed circuit board according to claim 9, wherein after said ring-shaped motor has been installed in said lens barrel, said planar portion is inserted into said lens barrel by sliding said plane portion along the optical axis.

14. A printed circuit board according to claim 13, wherein said planar portion is inserted into said lens barrel form a rear side of said lens barrel.

15. A printed circuit board according to claim 9, wherein said ring-shaped motor and said planar portion are disposed in such a manner that said ring-shaped motor and said planar portion overlap each other at least partially in the optical axis direction.

16. A printed circuit board according to claim 9, wherein and ring-shaped motor is a ring-shaped ultrasonic motor.

17. A printed circuit board including:

a first portion, an aperture being provided at a central portion of said first portion;

a plurality of second portions, said plurality of second portions extending in one of an inward and an outward radial direction from said first portion, electrical component chips being mounted on a surface of each of said plurality of second portions; and a bendable portion provided between said first portion and each of said second portions, wherein said bendable portion is bent to a position where said second portions are substantially perpendicular to said first portion.

18. A method for assembling a lens barrel including a printed circuit having a first portion with an aperture provided in a central region thereof, a second plurality of portions, extending in one of and inward and an outward radial direction from said first portion and having electrical component chips mounted thereon and bendable portions provided between said first portion and said second portions, said lens barrel comprising a hollow cylindrical barrel member containing a taking lens, said barrel having elongated cavities extending in a direction parallel to an optical axis of said lens barrel and arranged along an interior surface thereof and an annular-shaped cover, said method comprising the steps of:

(a) bending said second portion along said bendable portion arranged between said first and second portions so that said first and second portions are substantially perpendicular;

(b) inserting said second portion into an insertion end of one of said cavities until said first portion rests against a shoulder adjacent said insertion end which supports said first portion and so that the central opening in said first portion is aligned with an optical axis of sid taking lens and so that said first portion does not interfere with light rays entering the lens barrel and imaged by said taking lens;

(c) covering said end of said lens barrel receiving said printed circuit board assembly with said annular-shaped cover member; and (d) securing said cover member to said lens barrel.

19. The method of claim 18 wherein said cover member is provided with a first array of electrical contacts and said first portion is provided with a second array of electrical contacts and wherein step (b) further comprises the step of aligning the first array of contacts of said cover member with the second array of contacts on said first portion so that the first and second arrays are in alignment with and engage one another.

20. The method of claim 18 further comprising the step of mounting components only on said second portion and providing electrical connections only on said first portion for connecting said electrical components.

* * * * *